United States Patent
Paul et al.

(10) Patent No.: US 7,138,930 B1
(45) Date of Patent: Nov. 21, 2006

(54) MULTIPLE BYTE DATA PATH ENCODING/DECODING DEVICE AND METHOD

(75) Inventors: Somnath Paul, Fremont, CA (US); Hamid Khodabandehlou, Milpitas, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/937,138

(22) Filed: Sep. 9, 2004

Related U.S. Application Data

(60) Provisional application No. 60/503,570, filed on Sep. 17, 2003.

(51) Int. Cl.
*H03M 7/00* (2006.01)
(52) U.S. Cl. .......................................... 341/59; 341/50
(58) Field of Classification Search ................ 341/59, 341/58, 50; 370/465
See application file for complete search history.

(56) References Cited

U.S. PATENT DOCUMENTS

| | | | |
|---|---|---|---|
| 4,486,739 A | 12/1984 | Franaszek et al. | |
| 5,387,911 A | 2/1995 | Gleichert et al. | |
| 5,951,708 A | 9/1999 | Yoshida | |
| 6,195,764 B1 | 2/2001 | Caldara et al. | |
| 6,606,328 B1 * | 8/2003 | Susnow | 370/465 |
| 6,690,309 B1 | 2/2004 | James et al. | |

* cited by examiner

*Primary Examiner*—Rexford Barnie
*Assistant Examiner*—Joseph Lauture
(74) *Attorney, Agent, or Firm*—Bradley T. Sako

(57) ABSTRACT

Systems and methods for performing encoding and/or decoding can include an input data path that receives multiple input data values having an order (significance) with respect to one another. Each input data value can be applied to multiple compute paths (106-1 to 106-N), each of which can precompute multiple output values based on a different predetermined disparity value. Multiplexers (114-1 to 114-N) can output one precomputed output value according to a disparity value corresponding to a previous input data value in the order.

18 Claims, 6 Drawing Sheets

MULTIPLE BYTE DATA PATH ENCODING/DECODING DEVICE AND METHOD

This application claims the benefit of U.S. provisional patent application Ser. No. 60/503,570 Filed on Sep. 17, 2003.

TECHNICAL FIELD

The present invention relates generally to electronic circuits, and more particularly to circuits for performing encoding and/or decoding of multi-bit data values on multiple data paths.

BACKGROUND OF THE INVENTION

In many data communication applications the transmission of data values involves the encoding of data values at a transmission end, and the decoding of such encoded data values and a receive end. The "weight" of a transmitted data value (i.e., the number of ones versus the number of zeros) can affect the reliability of the data signal and/or provide a way of detecting transmission errors. In particular, in the event the number of ones exceeds the number of zeros, a system will develop a running disparity that is "positive". Conversely, if the number of zeros surpasses the number of ones, a system will develop a running disparity that is "negative". Either case can adversely affect transmission quality.

Consequently, for many type of transmission media it is desirable to seek a running disparity as close to zero as is possible.

Because data values are commonly processed in bytes, a very common type of encoding/decoding scheme is 8-bit/10-bit (8B/10B). That is, an eight bit byte is encoded into a ten bit value for transmission. Received 10-bit encoded values are decoded back into bytes.

Currently, 8B/10B encoding/decoding is a widely used scheme for error detection in conventional data communications and processing systems. For example, an unexpected running disparity value can indicate the presence of an error. However, such encoding/decoding can have additional advantages as well. In particular, in addition to improving transmission characteristics as noted above, such encoding decoding can enable clock recovery in certain applications, and can allow for easy delineation between control and data values (symbols).

To better understand various aspects of the present invention, a conventional 8B/10B computation model is shown in FIG. 6. FIG. 6 shows an encoder 600 that can receive input data values at an input 602, and provides output data values at an output 604. Any computation to generate an output value from an input value is dependent upon a previous running disparity value provided at a running disparity output 606. In the particular example of FIG. 6, a running disparity value is passed on for a next computation operation by flip-flop 608, which couples such a value to disparity input 610.

One very particular example of a conventional encoder/decoder, such as that shown as 600 in FIG. 6 is shown in FIG. 7. An encoder 700 can include compute blocks 702-0 to 702-3, inverters 704-0 and 704-1, and multiplexers (MUXs) 706-0 and 706-1. Compute blocks 702-0 and 702-1 can receive an input data value (or portions thereof) to generate non-inverted and inverted input values for MUXs (706-0 and 706-1). In addition, compute blocks 702-0 and 702-1 can generate disparity control values for compute block 702-3. According to disparity control values, compute block 702-3 can output inverted or non-inverted values at MUXs (706-0 and 706-1) to thereby generate an output value.

It is understood that the conventional block of FIG. 7 can be implemented to provide encoding functions, or alternatively, decoding functions.

In a conventional multiple data path arrangement, such as one that provides 8B/10B encoding/decoding, a running disparity value can be sequentially passed from the computation of one input value to the next. One example of such an arrangement is shown in FIG. 8.

FIG. 8 is a block schematic diagram showing a system that includes N+1 data paths, each of which computes an output value DOUT_0 to DOUT_N from a corresponding input value DIN_0 to DIN_N. A system 800 can include compute logic (CL) blocks 802-0 to 802-N. In the above arrangement, a running disparity from a first input value DIN_0 is computed by CL block 802-0 and provided at running disparity output 804-0. Such a running disparity value is the provided as an input to CL block 802-1, corresponding to the next input value (DIN_1). The computation of the resulting output value DOUT_1 by CL block 802-1 is dependent upon such a disparity value. As understood from the figure, a running disparity value from CL block 802-1 is provided as an input to CL block 802-2, and so on. Finally, a running disparity value for a last CL block 802-N is fed back to first CL block 802-0, by way of flip-flop 806.

In this way, the computation for one input value is dependent upon a running disparity generated in the computation for a previous input value. That is, each CL block must hold off a performing a computation until a previous running disparity value has been calculated.

While the above conventional multiple path encoding system can provide a large number of encoded values in parallel, such a system can have some disadvantages. One disadvantage can be that if Td is a compute delay (i.e., an encoding or decoding delay of a compute block), a total delay in computing all encoded values can be Td*(N+1), where N+1 is the number of input values in the data path.

In light of the above, it would be desirable to arrive at some way of providing multiple data path encoding that does not suffer from the delay of conventional systems, like that described above.

SUMMARY OF THE INVENTION

According to disclosed embodiments, an improved method and architecture are described that can allow for faster computation of encoding or decoding operations when multiple consecutive computations are required.

The present invention can include a system for encoding or decoding multi-bit data values. The system can include a data path for receiving a plurality of multi-bit data values including a first input data value and at least one other input data value. A plurality of compute engines can compute different output values in response to a single input value. Each of the other input data value (those input values that are not a first input value) can be input to at least two corresponding compute engines. Corresponding multiplexers (MUXs) can receive such output values from the compute engines.

In such an arrangement, multiple output values can be "precomputed" by the compute engines to cover a set of output values needed according to a running condition, such as a disparity value. This can allow for faster generation of output values, as computation will not be dependent upon the running condition.

According to one aspect of the embodiments, input data values can have a predetermined order of significance, with the first data value being the least significant data value. In addition, each MUX can have a select input coupled to an output of the MUX corresponding to the next less significant data value.

In such an arrangement, an output value can be output from each MUX according to the order of significance, introducing essentially only a MUX delay between output values. This can be faster than conventional arrangements that can introduce a computation delay between such values.

According to another aspect of the embodiments, each compute engine can compute a multi-bit output value and a disparity value corresponding to the multi-bit output value. In addition, each MUX can further include an input coupled to receive the disparity value for the output value provided by each of the corresponding compute engines. Each MUX can also have a disparity output that provides a selected disparity value at the select input of the MUX corresponding to the next more significant data value.

In such an arrangement, MUXs can output both an output data value and a corresponding disparity value. Further, such values can be provided based on sequential MUX operation.

According to another aspect of the embodiments, the compute engines corresponding those data values following a first data value can include a first disparity compute engine that provides an output value having a positive disparity, and a second disparity compute engine that provides an output value having a negative disparity.

In this way, output values are precomputed based on predetermined disparity values (e.g., high or low). One such output value can then be selected for output (as opposed to being computed) based on an incoming disparity value.

According to another aspect of the embodiments, each MUX can output the output value from the first disparity compute engine when the next less significant output data value has a negative disparity, and can output value of the second disparity compute engine when the next less significant output data value has a positive disparity.

In this way, MUXed output values can provide a set of output data values having an overall low disparity. That is, the overall number of zeros and ones for all output values can be close to equal, if not equal.

According to another aspect of the embodiments, the multiplexer corresponding to the most significant data value can provide a running disparity value that is coupled to a first compute engine that receives the least significant input data value.

In this way, an overall disparity for sequential output data values can be kept at a low level.

The present invention can also include a method for encoding/decoding multiple input values. The method can include receiving multiple input values having an order with respect to one another. For each input value, multiple output values can be precomputed based on different disparity values. Further, for each input value, one of the precomputed output values can be selected based on a running disparity corresponding to a previous input data value in the order.

In this way, output values are precomputed and then provided by a sequence of selecting steps rather than a sequence of computing steps.

According to one aspect of the embodiments, precomputed output values can be selected from the group consisting of: disparity values generated from an input value, encoded values generated from non-encoded input values, and decoded values generated from encoded input values.

Thus, advantages in performance can be achieved by precomputing output values for an encoding operation, a decoding operation, a disparity value computation, or combinations of the above.

According to another aspect of the embodiments, a method can further include propagating running disparity values corresponding to the first input value of the order to last input value of the order to thereby select one of the precomputed multiple output values for each input value. In addition, a running disparity value corresponding to the last input value can be applied to a compute block for the first input value.

In this way, sets of output values can be generated with continuously low overall disparity.

According to another aspect of the embodiments, a precomputing multiple output values can include encoding input values into encoded values having a larger number of bits than received input values.

In this way, the speed advantages of the embodiments can be utilized for encoding functions, such as 8B/10B encoding.

According to another aspect of the embodiments, precomputing multiple output values can include decoding input values into decoded values having a smaller number of bits than received input values.

In this way, the speed advantages of the embodiments can be utilized for decoding functions, such as 10B/8B encoding.

According to another aspect of the embodiments, precomputing multiple output values can include computing one output value to compensate for a positive disparity and computing another output value to compensate for a negative disparity.

The present invention may also include that system having a plurality of compute paths, each compute path receiving a multi-bit data input value and providing a multi-bit data output value. Each compute path can include a first compute block that computes a first precompute output value based on a preset first disparity value, and a second compute block that computes a second precompute output value based on a preset second disparity value. In addition, each compute block can include a multiplexer (MUX) that selects from the first and second precompute values to generate the data output value for the compute path.

According to another aspect of the embodiments, first and second compute blocks can encode an input data value according respective preset disparity values to generate precompute values having a larger number of bits that the input data value.

According to another aspect of the embodiments, first and second compute blocks can decode an input data value according respective preset disparity values to generate precompute values having a smaller number of bits that the input data value.

According to another aspect of the embodiments, first and second compute blocks can generate a disparity value according respective preset disparity values and the data input value for the compute path.

According to another aspect of the embodiments, the plurality of compute paths can have a significance with respect to one another. In addition, each first compute block can provide a first precomputed disparity value and a first precomputed output data value, and each second compute block can provide a second precomputed disparity value and second precomputed output data value. Further, each MUX can select the first precomputed disparity value and first precomputed output data value or the second precomputed disparity value and second precomputed output data value based on a disparity value output from the MUX of the compute path of next less significance.

According to another aspect of the embodiments, each compute path can further include the first compute block providing a first precomputed disparity value and the second compute block providing a second precomputed disparity value. In addition, each compute path also includes a first MUX that can select the first computed disparity value or the second computed disparity value based on a disparity value output from the MUX of the compute path of next less significance. A third compute block can compute a data output value based on the data input value of the compute path and the disparity value output from the MUX of the compute path of next less significance.

According to another aspect of the embodiments, the first compute block computes first precompute values based on a method selected from the group consisting of: eight-bit to ten-bit encoding and ten-bit to eight-bit decoding. Similarly, the second compute block computes the second precompute values based on a method selected from the group consisting of eight-bit to ten-bit encoding and ten-bit to eight-bit decoding.

DETAILED DESCRIPTION

Various embodiments of the present invention will now be described with reference to a number of diagrams. The embodiments show systems and methods that may encode values on multiple data paths by selectively outputting one of multiple pre-computed output values having different bit weights according to a running disparity value. Such a system and method can allow for faster computation of encoded or decoded values when multiple consecutive such computations are required every cycle.

It is understood that the term "byte" as used herein is not necessarily meant to specify a particular data value size (i.e., eight bits), but rather a multiple bit value. Thus, a "byte" as referred to in this Specification could be less than or greater than eight bits.

Figure 1:
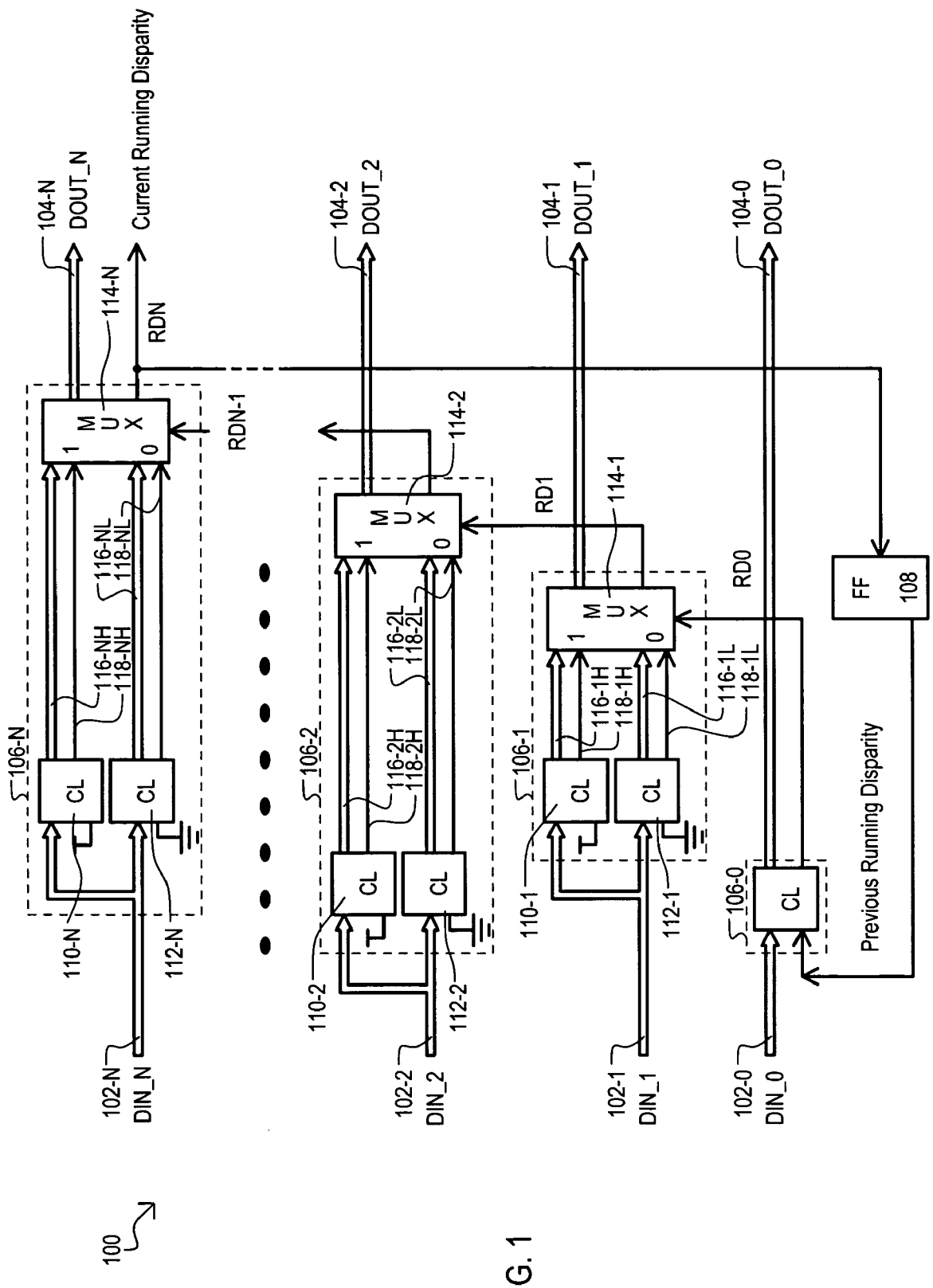
FIG. 1 is a block schematic diagram of a system according to one embodiment of the present invention.

A system according to a first embodiment is shown in FIG. 1 and designated by the general reference character 100. A system 100 can receive input data values on multiple input data paths 102-0 to 102-N and provide corresponding output data values on output data paths 104-0 to 104-N, respectively. Input data values are shown as DIN_0 to DIN_N and output data values are shown as DOUT_0 to DOUT_N. While such values may preferably correspond to 8B/10B encoding and/or decoding, such values should not necessarily be construed as being limited to any particular bit width.

Input data values (DIN_0 to DIN_N) and corresponding input data paths (102-0 to 102-N) can be conceptualized as having a significance with respect to one another. Data value DIN_0 can be considered a least significant data value while data value DIN_N can be considered a most significant data value. However, such significance is related to order of execution, and does not necessarily correspond to any numerical value or temporal order significance. In such an arrangement, data value DIN_0 can be considered a first data value in the order of significance, with the remaining data values being "next" data values.

A system can include compute paths 106-0 to 106-N, each of which can receive data input values DIN_0 to DIN_N, respectively, and provide data output values DOUT_0 to DOUT_N, respectively. In addition, each compute path (106-0 to 106-N) can provide a running disparity value (RD0 to RDN) to a compute path of the next greater significance, with the exception of last compute path 106-N. Disparity value RDN from last compute path 106-N can be fed back to first compute path 106-0. In the example of FIG. 1 such a feedback arrangement can include a flip-flop 108.

Unlike conventional arrangements, in embodiments according to the present invention, multiple output values for a given data path can be "precomputed". That is, multiple possible output values can be computed independent of any running disparity value. Such an arrangement can be accomplished by including multiple compute blocks in each compute path. Such multiple compute blocks can compute an output value based on various assumed disparity values, thus dispensing with need to "wait" for a running disparity value corresponding to a previous input value.

In the very particular example of FIG. 1, all but the first compute path (106-1 to 106-N) can include both a first compute block (110-1 to 110-N), second compute block (112-1 to 112-N), and a multiplexer MUX (114-1 to 114-N).

Both first and second compute blocks can provide a data value on a corresponding block data output (116-1L/H to 116-NL/H) and a disparity value on a block disparity output (118-1L/H to 118-NL/H). First compute blocks (110-1 to 110-N) can receive a data input value (DIN_0 to DIN_N) and generate an output value and disparity value based on a positive disparity input value. Thus, first compute blocks (110-1 to 110-N) are shown to include a disparity input connected to a high supply value. More particularly, first compute blocks (110-1 to 110-N) can operate in the same general fashion as a conventional encoder/decoder that receives a positive running disparity value. Conversely, second compute blocks (112-1 to 112-N) can operate in the same general fashion as a conventional encoder/decoder that receives a negative running disparity value. Thus, such blocks shown to include a disparity input connected to a low supply value.

MUXs (114-1 to 114-N) can have one set of inputs connected to the corresponding first block outputs (116-1H/118-1H to 116-NH/118-NH), and another set of inputs connected to second block outputs (116-1L/118-1L to 116-NL/118-NL). Select inputs of MUXs (114-1 to 114-N) can receive a disparity value from a compute path of next less significance. In this way, precomputed output and disparity values can be output by a corresponding MUX (114-1 to 114-N) according to a running disparity value propagated through previous MUXs.

Figure 8:
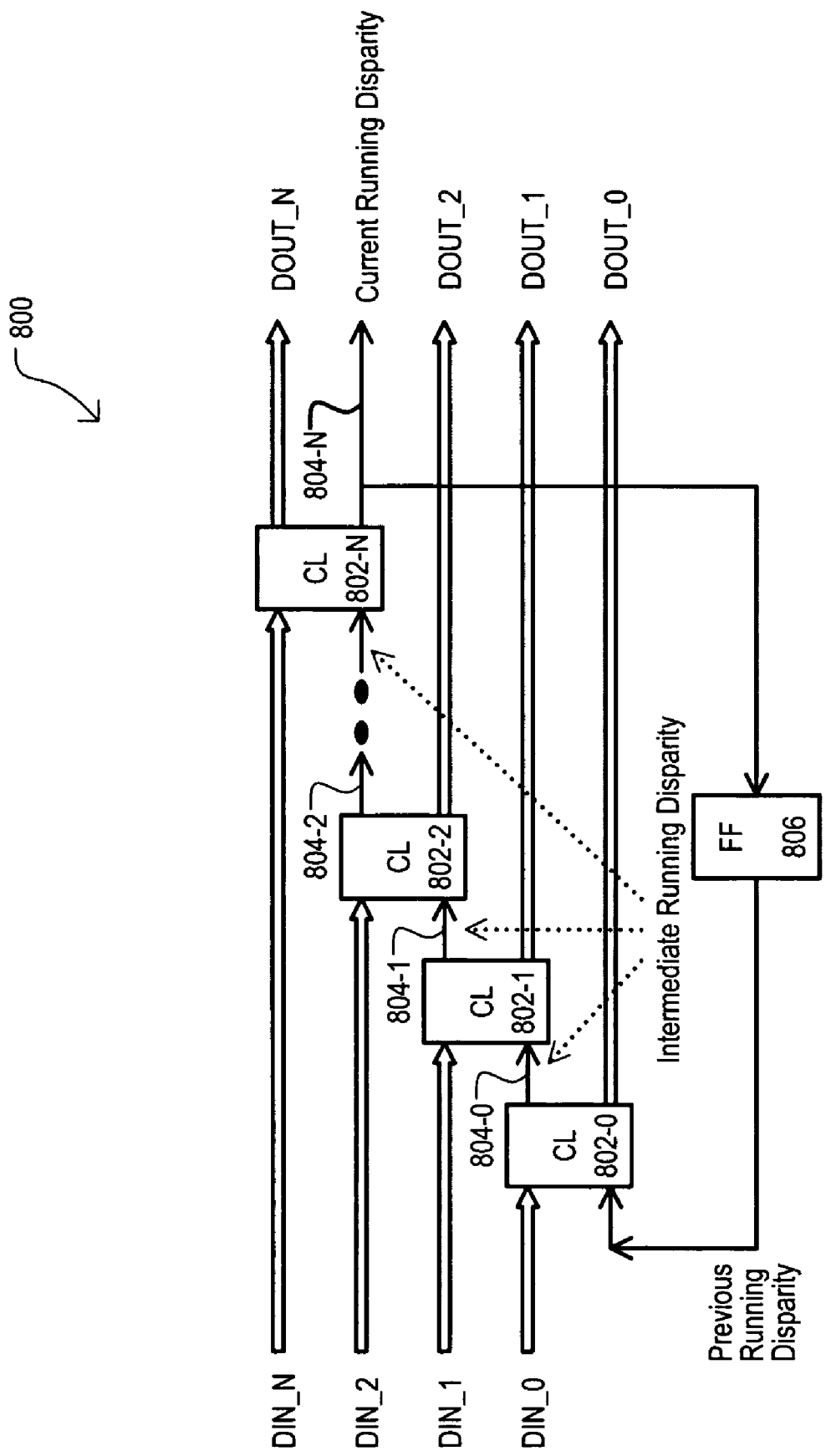
FIG. 8 is a block schematic diagram of a conventional system that provides multiple data value processing.

It is understood that the embodiment of FIG. 1, as compared to the conventional example of FIG. 8, can include adding an extra compute block for every input data value of a multiple data value path (except for the least significant data value).

It is also understood that in an arrangement like that of FIG. 1, computation for data values of higher significance can start at substantially the same time as a lowest significant byte and thus no waiting is needed for a previous data value computation (as would occur in the conventional case). While a running disparity output from the lowest significance compute path 106-0 will take a certain computation time, the computation corresponding to higher significance data values can start while that of the lowest significant data value gets computed. As described above, such "precomputation" can be performed using multiple cases of a possible disparity values.

As a result, if Td is the compute encoding/decoding delay for a data value, a total delay according to the embodiment of FIG. 1 can be Td plus the sum of the multiplexer delays Tmux, where the summation is done for all multiplexers that are present at the output of each compute path.

Figure 2B:
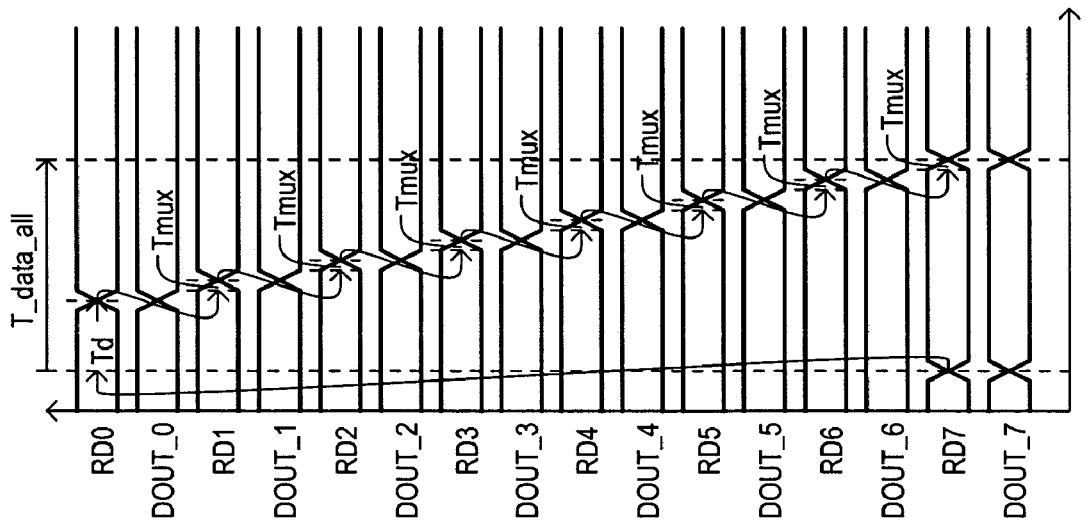
FIG. 2B is a timing diagram showing the operation of the embodiment of FIG. 1, where the value N is 7.
Figure 2A:
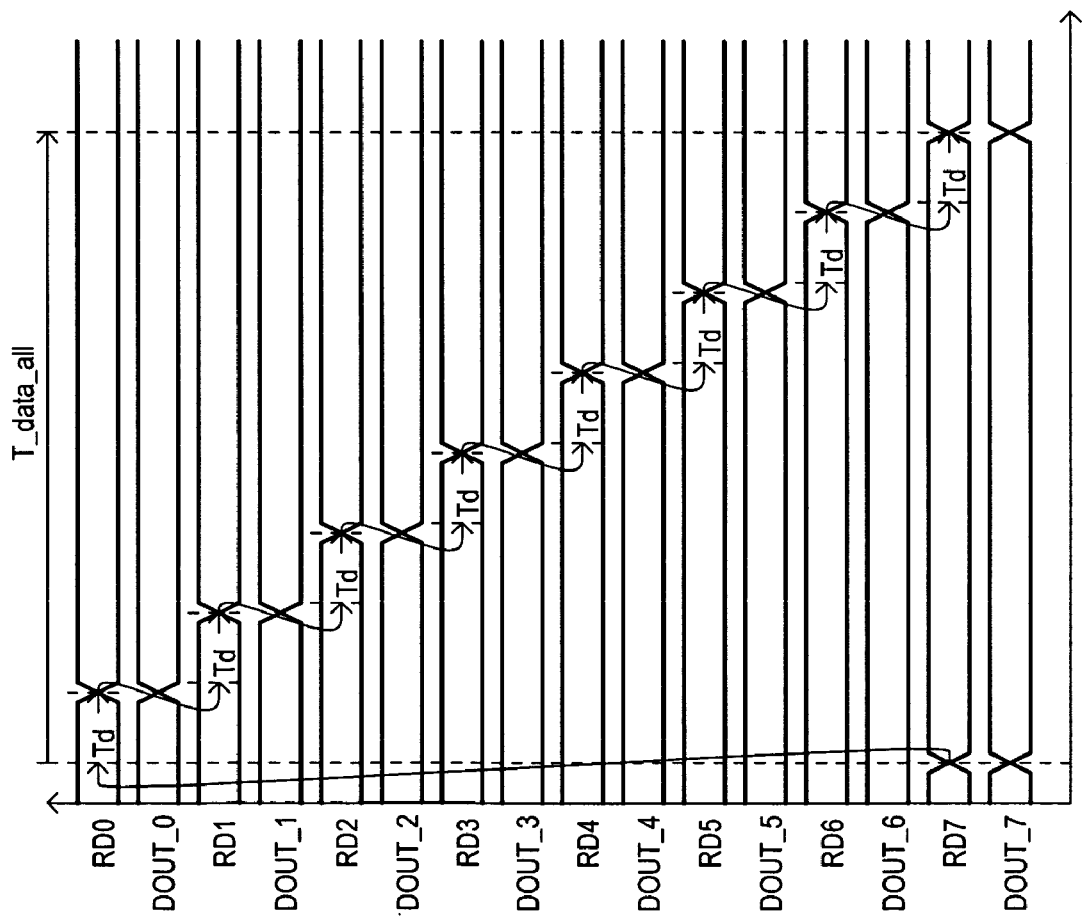
FIG. 2A is a timing diagram showing the operation of a conventional encoding/decoding system.

A comparison between operating delays according to the embodiment of FIG. 1 and a conventional approach like that of FIG. 8 is shown in FIGS. 2A and 2B. FIG. 2A is a timing diagram showing the operation of a conventional system that processes eight data values (i.e., N=7). FIG. 2B is a timing diagram showing the operation of an embodiment like that of FIG. 1 that also processes eight data values (i.e., N=7).

As shown by FIG. 2A, a total delay for processing multiple data values (T_data_all) can be given by:

$$T\_data\_all = \sum_{0}^{N} Td$$

where Td is a processing delay for a conventional compute block, and N+1 is the number of data values processed In sharp contrast, as shown by FIG. 2B, a total delay (T_data_all) according to the embodiment of FIG. 1 can be given by $$T\_data\_all = Td + \sum_{1}^{N} Tmux$$

where Td is a processing delay for a first compute path (e.g., 106-0), Tmux is a delay introduced by MUXs (114-1 to 114-N) of the remaining compute paths (106-1 to 106-N), and the number of input data values is N+1.

As would be understood by those skilled in the art, a MUX delay Tmux is almost always considerably smaller than a compute delay (Tmux <<<Td). Thus, processing according to a first embodiment can be considerably faster than conventional approaches.

Figure 3:
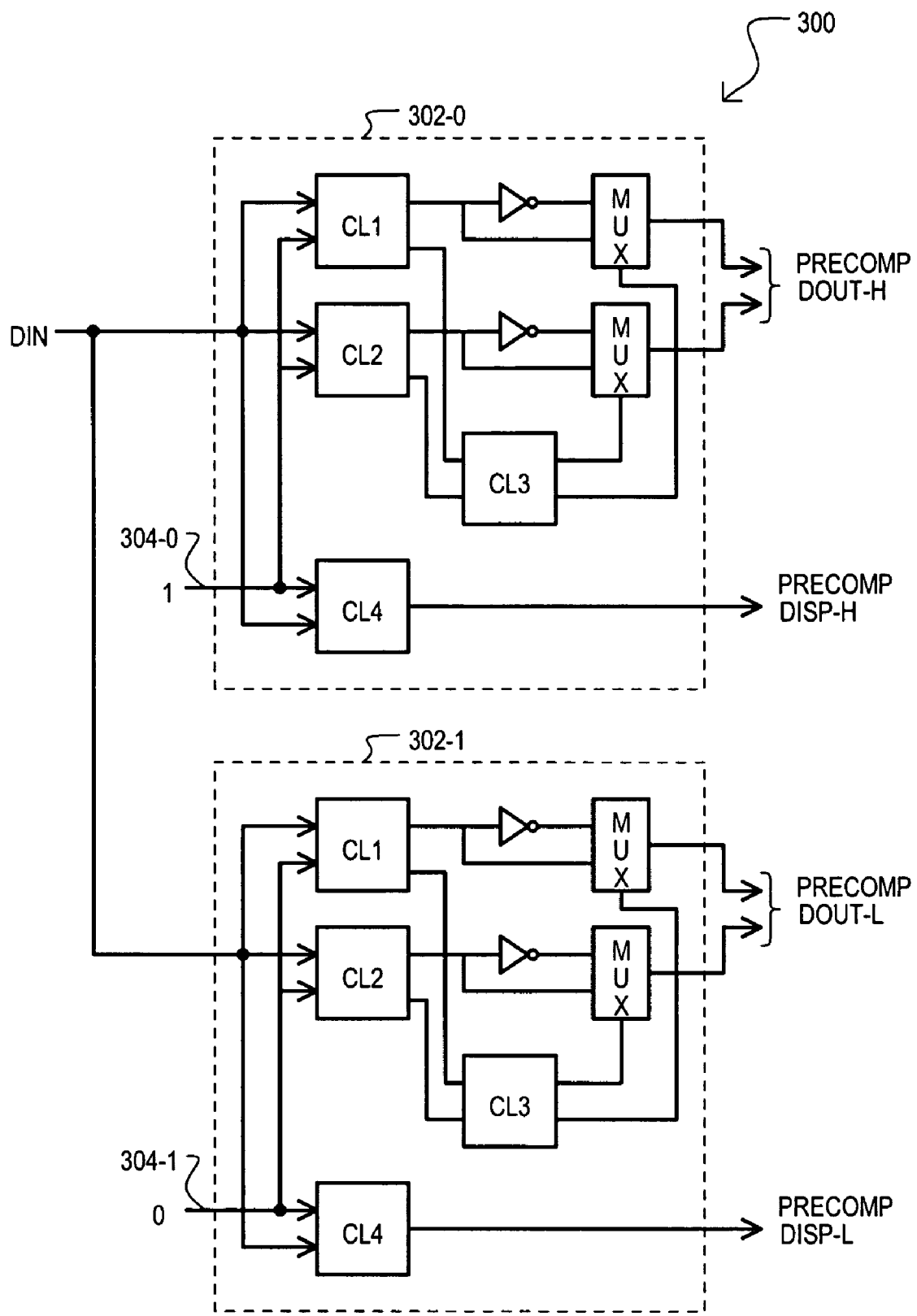
FIG. 3 is a block schematic diagram showing an example of compute block pairs according to one embodiment.
Figure 7:
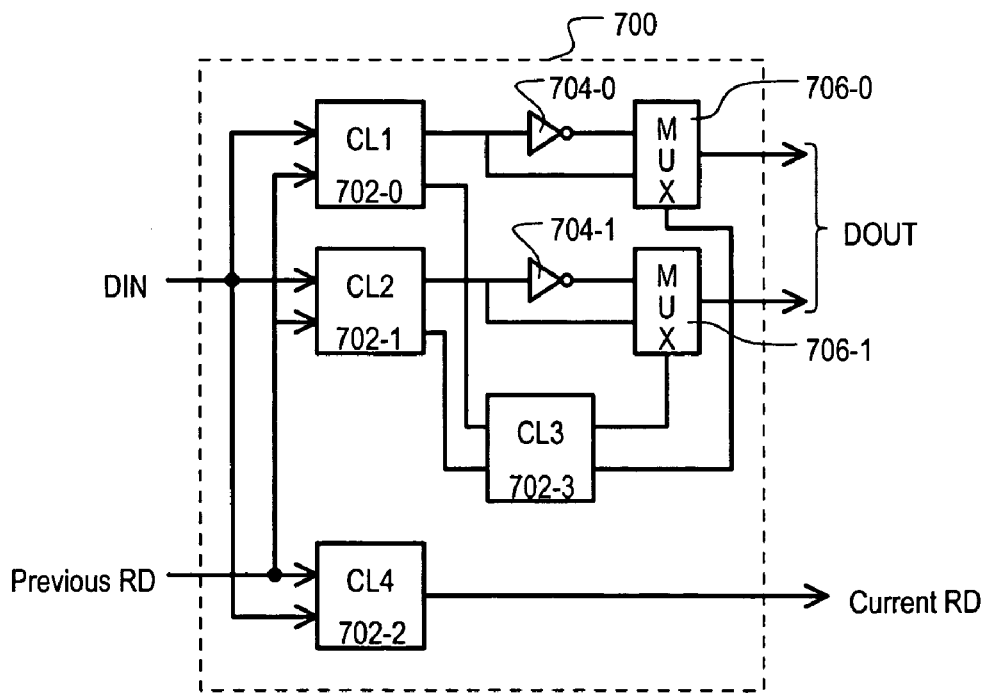
FIG. 7 is a block schematic diagram of a conventional encoder/decoder.

One very particular example of a first and second block compute pair is shown in FIG. 3 and designated by the general reference character 300. As shown in FIG. 3, a first compute block 302-0 and second compute block 302-1 can have the same general structure as a conventional encoder/decoder, such as that shown in FIG. 7, but with disparity inputs (304-0 and 304-1) to such blocks being preset to a particular value (1 and 0).

In an arrangement like that shown in FIGS. 1 and 3, a resulting gate count may be almost doubled as compared to the conventional approach. If implemented with a conventional hard-wired block, a gate count can be twice that of the conventional architecture. However, if implemented as a soft-wired block, compute blocks that receive a disparity value as an input, can be more compact than a conventional block as a synthesis tool could optimizes such a compute block based on the hard-coded '0' or '1' input level.

As is well understood, a "hard-wired" block is sometimes called a "full custom" block, where the logic and layout is optimized and "locked down" with timing and area for the block being essentially fixed. Such a block can be advantageously re-used in the same configuration in different designs. A "soft-wired" block is one where the optimized block may be re-used in different configurations in future embodiments. The timing and area used by the soft-wired block may vary between implementations.

While the embodiments of FIGS. 1 and 2 can provide processing speed advantages over conventional approaches, alternate embodiments can provide a smaller increase in gate count at the cost of some increase in delay. One such alternate embodiment is shown in FIG. 4.

Figure 4:
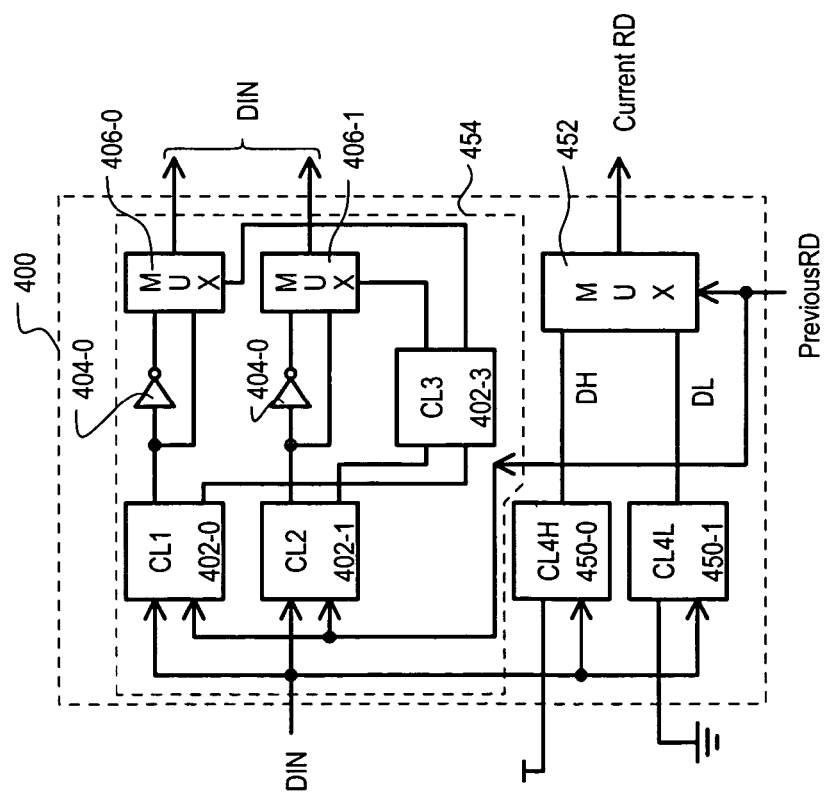
FIG. 4 is a block schematic diagram of a data path according to another embodiment.
Figure 6:
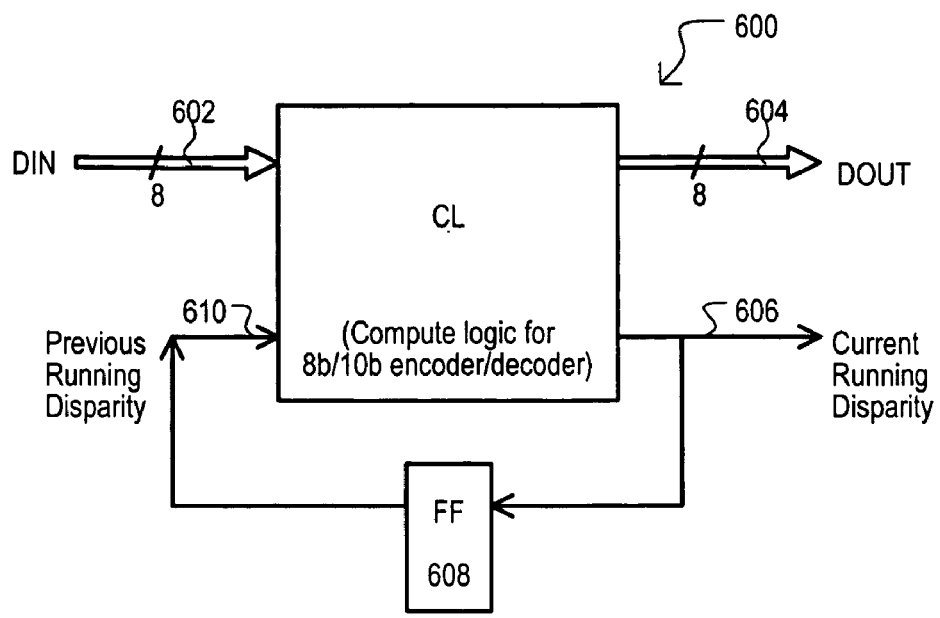
FIG. 6 is a block diagram of a conventional encoder/decoder.

FIG. 4 is a block schematic diagram of compute path according to an alternate embodiment. Such a compute path 400 can include some of the same general components as the conventional encoder/decoder of FIG. 8. Such like components are referred to by the same reference characters, but with the first digit being a "4" instead of an "8". Thus, a description of such components will be omitted.

The embodiment of FIG. 4 can differ from that of FIG. 8, in that it does not include a compute block like 802-2 which computes a current running disparity value based on an input data value and a previous disparity value. Instead, a compute path 400 can include compute blocks 450-0 and 450-1 and a MUX 452.

Compute blocks (450-0 and 450-1) can precompute disparity values in the same general way as described above. In particular, compute block 450-0 can receive a data input value and generate a precomputed disparity value DH based on a positive disparity input value. Compute block 450-1 can receive the data input value and generate a precomputed disparity value DL based on a negative disparity input value. Thus, the computation of such disparity values is not dependent upon a previous disparity value.

Precomputed disparity values DH and DL can be provided as inputs to MUX 452. MUX 452 can select one of the precomputed disparity values (DH and DL) based a disparity value from a previous compute path in a system. Such an output value can then serve as a disparity value for a next compute path of a system (or first compute path if the value is output from a last compute path).

An alternate way of conceptualizing the arrangement of FIG. 4 is to consider the upper portion a single compute block 454 that computes an output value from an input value and received disparity value, in an essentially conventional manner. The embodiment differs from the conventional case in the precomputation techniques are utilized to generate a running disparity value, rather than both an output value and a running disparity value (as in FIGS. 1 and 3).

In the embodiment of FIG. 4, circuit blocks can be changed with respect to a conventional case of FIG. 8 such that a running disparity computation can be separate from a data computation. As such, only a running disparity compute logic need be duplicated. Consequently there may be a benefit in terms of number of gates needed to implement. However, as noted above, there can be sacrifice in terms of timing performance, as the delay introduced by such arrangement no longer includes essentially only multiplexer delay (Tmux).

Compute paths according to the embodiment of FIG. 4 can be repeated and interconnected in the same general fashion as the embodiment of FIG. 1 to implement and encode or decode operation. Such an arrangement could differ from FIG. 1 in that only the logic for computing a running disparity is duplicated within each compute path and an output MUX is provided only for running disparity computation.

However, in a system that employs compute paths like that of FIG. 4, a gate count will not be essentially doubled, as only the portion of logic for running disparity generation is duplicated. In one very particular implementation, duplicated logic would take up to approximately 25% of the overall design.

As compared to the embodiments of FIGS. 1 and 3, a resulting delay for the embodiment of FIG. 4 would be greater, because a last compute stage within each compute path involves a computation of the output data based on the previous running disparity. In the embodiments of FIGS. 1 and 3, only a multiplexer delay is involved.

Figure 5:
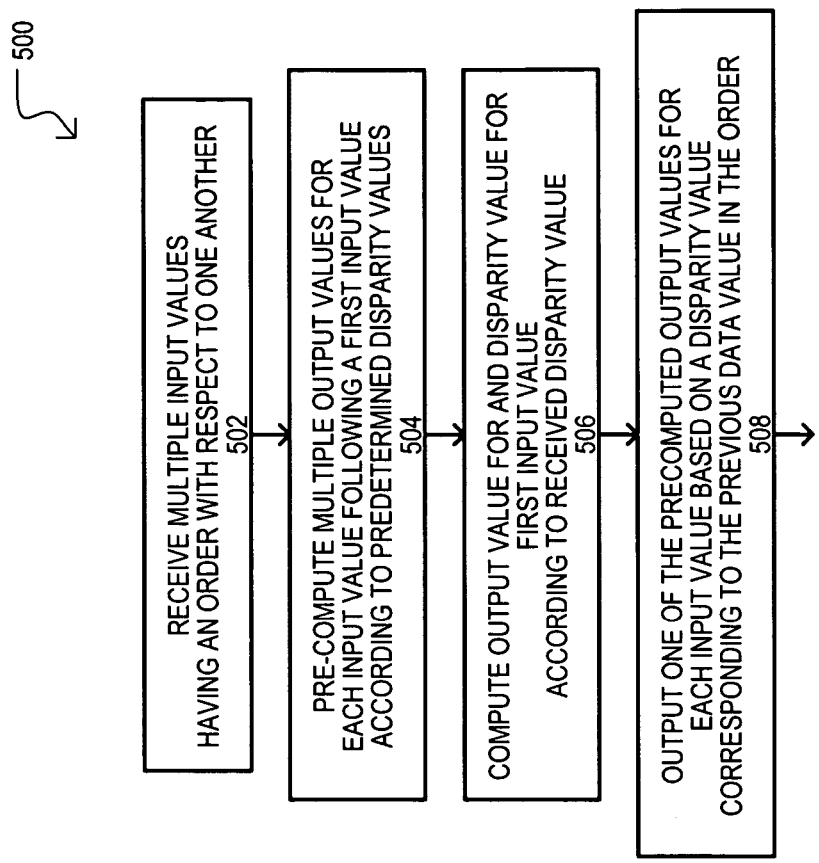
FIG. 5 is a flow diagram showing a method according to one embodiment.

Having described systems and system blocks according to various embodiments, a method according to one embodiment will now be described with reference to FIG. 5.

A method 500 can include receiving multiple input values having an order with respect to one another (step 502). As but one example, such a step can include receiving multiple byte values essentially in parallel on data paths. Such byte values can be unencoded (e.g., 8-bit values) or encoded values (e.g., 10-bit values). An order refers to an operational order, and should not be construed as a temporal order.

A method 500 can further include precomputing multiple output values for each input value following a first input value. The precomputation of such output values can be based on predetermined disparity values (step 504). The term "precomputation" can refer to a computation that can begin essentially upon reception of an input value. As but one example, a step 504 can include precomputing output values to compensate for high and low disparities.

A method 500 can also include computing an output value and disparity value for a first data value based on a received disparity value (step 506). As but one example, such a step can include an essentially conventional encoding/decoding step. Further, a received disparity value can be some initial value (for a start-up operation) or a disparity value corresponding to a last data value of the order.

Of the multiple precomputed output values computed for each single input value, one such output value can be output based on a disparity value corresponding to a previous data value in the order (step 508). In one particular example, such a step can include multiplexing precomputed output values based on a received disparity value. In this way, precomputed output values can be sequentially output according to the data value order, and can have an overall low disparity value as each output value compensates for the disparity of the previous output value.

An advantage of the improved method and architecture over the conventional solution is that the improved solution can be faster than conventional approaches.

While the embodiments of the present invention can enjoy wide application, the embodiments may be particularly useful for providing faster computation in 8B/10B encoding or decoding when there are multiple such consecutive computations required every cycle. One exemplary application can be a Fibre Channel high speed parallel interface (HSPI) bus interface where a 10-bit data value is transferred on either edge of the clock.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment.

Accordingly, it is understood that while the various aspects of the particular embodiment set forth herein has been described in detail, the present invention could be subject to various changes, substitutions, and alterations without departing from the spirit and scope of the invention.

What is claimed is:

1. A system for encoding/decoding multi-bit data values, comprising:

a datapath for receiving a plurality of multi-bit input data values including a first input data value and at least one other input data value, the input data values have a predetermined order of significance, with the first input data value being the least significant input data value and a last input data value being a most significant input data value;

a plurality of compute engines that compute different output values in response to an input value, each other input data value being input to least two corresponding compute engines; and a multiplexer (MUX) corresponding to each other input data value, each MUX having inputs that receive output values of the compute engines corresponding to the other input data value, each MUX having a select input coupled to an output of another MUX, the multiplexer corresponding to the most significant input data value provides a running disparity value that is coupled to a first compute engine that receives the least significant input data value.

2. The system of claim 1, wherein:

the input data values have a predetermined order of significance, with the first data value being the least significant data value; and each MUX has a select input coupled to an output of the MUX corresponding to the next less significant data value.

3. The system of claim 2, wherein:
each compute engine computes a multi-bit output value and a disparity value corresponding to the multi-bit output value; and
each MUX further includes
inputs coupled to receive a disparity value for the output value provided by each of the corresponding compute engines, and
a disparity output that provides a selected disparity value at the select input of the MUX corresponding to the next more significant data value.

4. The system of claim 1, wherein:
the at least two compute engines corresponding to each input data value include
a first disparity compute engine that provides a precomputed output value having a positive disparity, and
a second disparity compute engine that provides a precomputed output value having a negative disparity.

5. The system of claim 4, wherein:
the data values have a predetermined order of significance, with the first data value being the least significant data value; and
each MUX outputs the output value of the first disparity compute engine when the next less significant output value has a negative disparity and outputs the output value of the second disparity compute engine when the next less significant output value has a positive disparity.

6. The system of claim 1, wherein:
each of the at least two corresponding compute engines computes a running disparity value according to an input data value and a predetermined disparity value; and
each MUX outputs one of the running disparity values in response to running disparity value corresponding to a different input data value.

7. A method for encoding/decoding multiple input values, comprising the steps of:
receiving multiple input values in parallel with one another having an order with respect to one another;
for each input value, precomputing multiple output values based on different disparity values;
for each input value, selecting one of the precomputed output values based on a running disparity corresponding to a previous input value of the order;
propagating running disparity values corresponding to the first input value of the order to last input value of the order to thereby select one of the recomputed multiple output values for each input value; and
applying a running disparity value corresponding to the last input value of the order to a compute block for the first input value of the order.

8. The method of claim 7, wherein;
the precomputed output values are selected from the group consisting of: disparity values generated from an input data value, encoded values generated from non-encoded input data values, and decoded values generated from encoded input data values.

9. The method of claim 7, wherein:
precomputing multiple output values based on different disparity values includes encoding input values into encoded values having a larger number of bits than received input values.

10. The method of claim 7, wherein:
precomputing multiple output values based on different disparity values includes decoding input values into decoded values having a smaller number of bits than received input values.

11. The method of claim 7, wherein:
precomputing multiple output values based on different disparity values includes computing one output value to compensate for a positive disparity and computing another output value to compensate for a negative disparity.

12. A system, comprising:
a plurality of compute paths, each compute path receiving a multi-bit data input value and providing a multi-bit data output value, the compute paths having a significance with respect to one another, each compute path comprising,
at least one first compute block that computes a first precompute output value based on a preset first disparity value,
at least one second compute block that computes a second precompute output value based on a preset second disparity value,
a multiplexer (MUX) that selects from at least the first and second precompute values to generate the data output value for the compute path, and
at least a third compute block that computes a data output value based on the data input value of the compute path and the disparity value output from the MUX of the compute path of next less significance.

13. The system of claim 12, wherein:
the first and second compute blocks encode an input data value according respective preset disparity values to generate precompute values having a larger number of bits that the input data value.

14. The system of claim 12, wherein:
the first and second compute blocks decode an input data value according respective preset disparity values to generate precompute values having a smaller number of bits that the input data value.

15. The system of claim 12, wherein:
the first and second compute blocks generate a disparity value according respective preset disparity values and the data input value for the compute path.

16. The system of claim 12, wherein:
the plurality of compute paths have a significance with respect to one another, and
each first compute block provides at least a first precomputed disparity value and first precomputed output data value,
each second compute block provides at least a second precomputed disparity value and second precomputed output data value,
each MUX selects the first precomputed disparity value and first precomputed output data value or the second precomputed disparity value and second precomputed output data value based on a disparity value output from the MUX of the compute path of next less significance.

17. The system of claim 12, wherein:
each compute path further includes
each first compute block providing a first precomputed disparity value,
each second compute block provides a second precomputed disparity value,
a first MUX that selects the first computed disparity value or the second computed disparity value based on a disparity value output from the MUX of the compute path of next less significance.

18. The system of claim 12, wherein:

the at least one first compute block computes the first precompute value based on a method selected from the group consisting of eight-bit to ten-bit encoding and ten-bit to eight-bit decoding, and the at least one second compute block computes the second precompute value based on a method selected from the group consisting of eight-bit to ten-bit encoding and ten-bit to eight-bit decoding.

\* \* \* \* \*